United States Patent
Kishimoto et al.

(10) Patent No.: US 10,951,193 B2
(45) Date of Patent: Mar. 16, 2021

(54) ELASTIC WAVE DEVICE

(71) Applicant: Murata Manufacturing Co., Ltd., Nagaokakyo (JP)

(72) Inventors: Yutaka Kishimoto, Nagaokakyo (JP); Masashi Omura, Nagaokakyo (JP); Tetsuya Kimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 64 days.

(21) Appl. No.: 15/879,467

(22) Filed: Jan. 25, 2018

(65) Prior Publication Data

US 2018/0152171 A1    May 31, 2018

Related U.S. Application Data

(63) Continuation of application No. PCT/JP2016/068569, filed on Jun. 22, 2016.

(30) Foreign Application Priority Data

Sep. 9, 2015 (JP) .............................. JP2015-177601

(51) Int. Cl.
  *H03H 9/145* (2006.01)
  *H03H 9/02* (2006.01)
  (Continued)

(52) U.S. Cl.
  CPC .............. *H03H 9/145* (2013.01); *H03H 3/02* (2013.01); *H03H 9/02228* (2013.01);
  (Continued)

(58) Field of Classification Search
  CPC ...... H03H 9/145; H03H 9/02574; H03H 9/05; H03H 9/25; H03H 9/175; H03H 9/173;
  (Continued)

(56) References Cited

U.S. PATENT DOCUMENTS

2011/0273061 A1\* 11/2011 Thalmayr .......... H03H 9/02275
  310/346
2013/0057360 A1\* 3/2013 Meltaus ............. H03H 9/02228
  333/187
(Continued)

FOREIGN PATENT DOCUMENTS

CN        102870325 A      1/2013
CN        104205629 A     12/2014
(Continued)

OTHER PUBLICATIONS

Yen, "Experimental Study of Fine Frequency Selection Techniques for Piezoelectric Aluminum Nitride Lamb Wave Resonators", Technical Report No. UCB/EECS-2013-189, Dec. 1, 2013, 54 pages.

(Continued)

*Primary Examiner* — Samuel S Outten
(74) *Attorney, Agent, or Firm* — Keating & Bennett, LLP

(57) ABSTRACT

An elastic wave device includes an interdigital transducer electrode including electrode fingers provided on a first principal surface of a piezoelectric thin film. A conductive layer is provided on a second principal surface of the piezoelectric thin film. An elastic wave propagates in the piezoelectric thin film in an S0 mode of a plate wave, and a piezoelectric thin film portion in a region below spaces between the electrode fingers of the interdigital transducer electrode is displaced by a greater amount than each electrode finger and a piezoelectric thin film portion in a region below each electrode finger.

19 Claims, 12 Drawing Sheets

(51) Int. Cl.
    *H03H 9/17*    (2006.01)
    *H03H 9/25*    (2006.01)
    *H03H 9/05*    (2006.01)
    *H03H 3/02*    (2006.01)

(52) U.S. Cl.
    CPC .......... *H03H 9/02574* (2013.01); *H03H 9/05* (2013.01); *H03H 9/173* (2013.01); *H03H 9/175* (2013.01); *H03H 9/25* (2013.01); *H03H 2003/025* (2013.01)

(58) Field of Classification Search
    CPC .. H03H 9/0228; H03H 3/02; H03H 2003/025; H04H 9/25
    See application file for complete search history.

(56) References Cited

U.S. PATENT DOCUMENTS

| | | | |
|---|---|---|---|
| 2013/0300253 A1* | 11/2013 | Kimura | H03H 9/02818 310/313 A |
| 2014/0152146 A1 | 6/2014 | Kimura et al. | |
| 2015/0028720 A1 | 1/2015 | Kando | |
| 2015/0061466 A1 | 3/2015 | Kimura et al. | |
| 2016/0294361 A1 | 10/2016 | Yamane et al. | |

FOREIGN PATENT DOCUMENTS

| | | |
|---|---|---|
| WO | 2012/086441 A1 | 6/2012 |
| WO | 2013/172287 A1 | 11/2013 |
| WO | 2015/098756 A1 | 7/2015 |

OTHER PUBLICATIONS

Kadota et al., "High Frequency and Ultra Wide Band Resonators using Plate Acoustic Waves in LiNbO3 and Application to Tunable Filter", 2012 International Symposium on Acoustic Wave Devices for Future Mobile Communication Systems, Dec. 6-7, 2012, 7 pages.

Gong et al., "Laterally Vibrating Lithium Niobate MEMS Resonators with High Electromechanical Coupling and Quality Factor", IEEE International Ultrasonics Symposium Proceedings, 2012, pp. 1051-1054.

Lin et al., "AlN/3C-SiC Composite Plate Enabling High-Frequency and High-Q Micromechanical Resonators" Advanced Materials, 2012, pp. 2722-2727.

Official Communication issued in International Patent Application No. PCT/JP2016/068569, dated Sep. 20, 2016.

Official Communication issued in corresponding Chinese Patent Application No. 201680048608.9, dated Sep. 14, 2020.

\* cited by examiner

ELASTIC WAVE DEVICE

CROSS REFERENCE TO RELATED APPLICATIONS

This application claims the benefit of priority to Japanese Patent Application No. 2015-177601 filed on Sep. 9, 2015 and is a Continuation Application of PCT Application No. PCT/JP2016/068569 filed on Jun. 22, 2016. The entire contents of each application are hereby incorporated herein by reference.

BACKGROUND OF THE INVENTION

1. Field of the Invention

The present invention relates to an elastic wave device utilizing an S0 mode of plate waves.

2. Description of the Related Art

Various elastic wave devices that include a piezoelectric thin film and that utilize plate waves have been proposed. For example, International Publication No. WO2012/086441 A1 discloses an elastic wave device utilizing an A1 mode or an S0 mode of plate waves as high-acoustic-velocity plate waves. In the elastic wave device disclosed in International Publication No. WO2012/086441 A1, an acoustic reflection layer is provided on a supporting substrate. A piezoelectric thin film is laminated on the acoustic reflection layer. An interdigital transducer electrode is provided on the upper surface of the piezoelectric thin film.

The elastic wave device disclosed in International Publication No. WO2012/086441 A1 is able to achieve an increase in acoustic velocity, band width expansion, and an increase in impedance ratio by using plate waves, as compared to using surface acoustic waves.

However, the inventors of preferred embodiments of the present invention have discovered a new problem that, in an elastic wave device utilizing an S0 mode of plate waves, variations in acoustic velocity or frequency characteristics become large depending on the film thickness of the interdigital transducer electrode.

SUMMARY OF THE INVENTION

Preferred embodiments of the present invention provide elastic wave devices that utilizes an S0 mode of plate waves and in which variations in acoustic velocity or frequency characteristics are less likely to occur even when an electrode film thickness is changed.

An elastic wave device according to a preferred embodiment of the present invention includes a piezoelectric thin film including a first principal surface and a second principal surface opposing the first principal surface; an interdigital transducer electrode provided on the first principal surface of the piezoelectric thin film and including a plurality of electrode fingers; and a conductive layer provided on the second principal surface of the piezoelectric thin film, an elastic wave propagating in the piezoelectric thin film is an S0 mode of a plate wave, and a piezoelectric thin film portion in a region below spaces between the electrode fingers of the interdigital transducer electrode is displaced by a greater amount than each electrode finger and a piezoelectric thin film portion in a region below each electrode finger.

In an elastic wave device according to a preferred embodiment of the present invention, a change in an acoustic velocity when a thickness of the interdigital transducer electrode is changed by one wavelength is preferably not greater than about 9300 m/sec.

In an elastic wave device according to a preferred embodiment of the present invention, when the thickness of the interdigital transducer electrode is changed by one wavelength, a change in the acoustic velocity is not greater than about 1000 m/sec.

In an elastic wave device according to a preferred embodiment of the present invention, in Euler Angles ($\varphi$, $\theta$, $\psi$) of the piezoelectric thin film, $\varphi$ is within a range of about 0°±20°, $\theta$ is within a range of not less than about 75° and not greater than about 145°, and $\psi$ is within a range of about 0°±10°.

An elastic wave device according to a preferred embodiment of the present invention includes a piezoelectric thin film including a first principal surface and a second principal surface opposing the first principal surface; an interdigital transducer electrode provided on the first principal surface of the piezoelectric thin film and including a plurality of electrode fingers; and a conductive layer provided on the second principal surface of the piezoelectric thin film, an elastic wave propagating in the piezoelectric thin film is an S0 mode of a plate wave, and a change in an acoustic velocity when a thickness of the interdigital transducer electrode is changed by one wavelength is not greater than about 9300 m/sec.

In an elastic wave device according to a preferred embodiment of the present invention, when the thickness of the interdigital transducer electrode is changed by one wavelength, a change in the acoustic velocity is preferably not greater than about 1000 m/sec.

In an elastic wave device according to a preferred embodiment of the present invention, in Euler Angles ($\varphi$, $\theta$, $\psi$) of the piezoelectric thin film, $\varphi$ is within a range of about 0°±20°, $\theta$ is within a range of not less than about 75° and not greater than about 145°, and $\psi$ is within a range of about 0°±10°.

An elastic wave device according to a preferred embodiment of the present invention includes: a piezoelectric thin film made of $LiNbO_3$ and including a first principal surface and a second principal surface opposing the first principal surface; an interdigital transducer electrode provided on the first principal surface of the piezoelectric thin film and including a plurality of electrode fingers; and a conductive layer provided on the second principal surface of the piezoelectric thin film, an elastic wave propagating in the piezoelectric thin film is an S0 mode of a plate wave, and in Euler Angles ($\varphi$, $\theta$, $\psi$) of the piezoelectric thin film, $\varphi$ is within a range of about 0°±20°, $\theta$ is within a range of not less than about 75° and not greater than about 145°, and $\psi$ is within a range of about 0°±10°.

In an elastic wave device according to a preferred embodiment of the present invention, the elastic wave device further includes a supporting substrate, and the conductive layer is laminated directly or indirectly on the supporting substrate.

In an elastic wave device according to a preferred embodiment of the present invention, the elastic wave device further includes an acoustic reflection layer, and the acoustic reflection layer is provided between the conductive layer and the supporting substrate and has a high acoustic impedance layer having relatively high acoustic impedance and a low acoustic impedance layer having relatively low acoustic impedance.

In an elastic wave device according to a preferred embodiment of the present invention, the high acoustic impedance layer is made of silicon nitride, Pt, W, or tantalum oxide, and the low acoustic impedance layer is made of silicon oxide. In this case, it is possible to further effectively trap plate waves within the piezoelectric thin film.

In an elastic wave device according to a preferred embodiment of the present invention, an elastic wave device further includes a supporting layer, the supporting layer supports the supporting substrate and the conductive layer, and a hollow portion is provided within the elastic wave device and is surrounded by the supporting substrate, the conductive layer, and the supporting layer.

According to preferred embodiments of the present invention, it is possible to provide elastic wave devices that utilize an S0 mode of plate waves and in which a change in acoustic velocity or frequency characteristics is less likely to occur even when the film thickness of an interdigital transducer electrode is changed.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, specific preferred embodiments of the present invention will be described with reference to the drawings in order to clarify the present invention.

It should be noted that each preferred embodiment described in the present specification is illustrative, and the components in the different preferred embodiments may be partially replaced or combined.

Figure 1A:
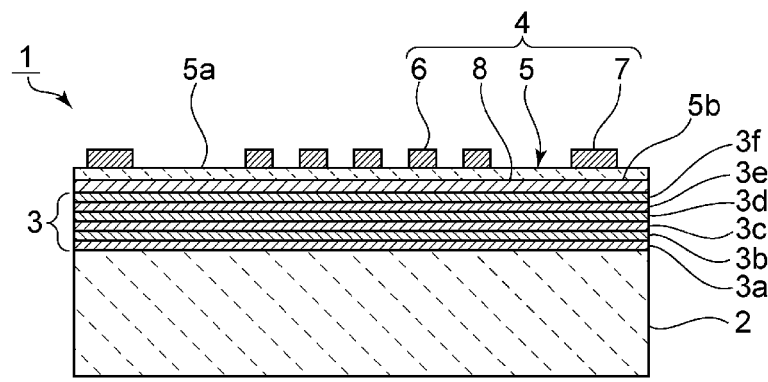
FIG. 1A is a front cross-sectional view of an elastic wave device according to a first preferred embodiment of the present invention.
Figure 1B:
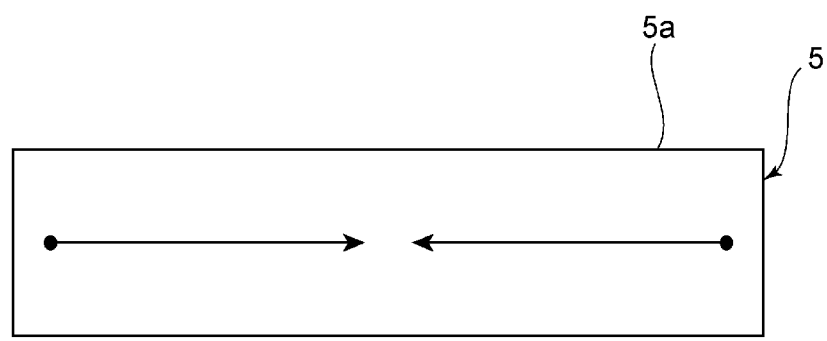
FIG. 1B is a schematic diagram for explaining an S0 mode of plate waves.

FIG. 1A is a front cross-sectional view of an elastic wave device according to a first preferred embodiment of the present invention, and FIG. 1B is a schematic diagram for explaining an S0 mode of plate waves.

The elastic wave device 1 includes a supporting substrate 2. The supporting substrate 2 is preferably made of Si, for example. However, the material used to make the supporting substrate 2 is not particularly limited.

An acoustic reflection layer 3 is provided on the supporting substrate 2. The acoustic reflection layer 3 includes high acoustic impedance layers 3a, 3c, and 3e with relatively high acoustic impedance, and low acoustic impedance layers 3b, 3d, and 3f with relatively low acoustic impedance. The high acoustic impedance layers 3a, 3c, and 3e and the low acoustic impedance layers 3b, 3d, and 3f are alternately laminated. Another layer, such as an adhesive layer, may be provided between the supporting substrate 2 and the high acoustic impedance layer 3a. The low acoustic impedance layer 3f is laminated below a later-described conductive layer 8.

The materials used to make the high acoustic impedance layers 3a, 3c, and 3e and the low acoustic impedance layers 3b, 3d, and 3f are not particularly limited as long as the above acoustic impedance relationship is satisfied. For example, an insulating ceramic material, such as silicon oxide, silicon nitride, and alumina, a piezoelectric ceramic material such as ZnO, a semiconductor such as Si, or a metal or such as Au, Pt, Cu, and Al or an alloy thereof may preferably be used.

In the present preferred embodiment, the high acoustic impedance layers 3a, 3c, and 3e are preferably made of, for example, SiN, which is silicon nitride. Alternatively, the high acoustic impedance layers 3a, 3c, and 3e may preferably be made of Pt, for example. The low acoustic impedance layers 3b, 3d, and 3f are preferably made of SiO$_2$, for example, which is silicon oxide.

An elastic wave element portion 4 that excites plate waves is laminated on the acoustic reflection layer 3. The elastic wave element portion 4 includes a piezoelectric thin film 5. The piezoelectric thin film 5 includes a first principal surface 5a and a second principal surface 5b opposing the first principal surface 5a. An interdigital transducer electrode 6 is provided on the first principal surface 5a. In addition, a connection wire 7 electrically connected to the interdigital transducer electrode 6 is provided on the first principal surface 5a. The conductive layer 8 is provided so as to cover the second principal surface 5b.

The interdigital transducer electrode 6 and the connection wire 7 are made of an appropriate metal or alloy. In the present preferred embodiment, the interdigital transducer electrode 6 and the connection wire 7 are preferably made of Al, for example. In addition, the conductive layer 8 may be made of Ti or Al, for example. Moreover, the conductive layer 8 may be made of an appropriate metal or alloy, for example.

The piezoelectric thin film 5 is preferably made of LiNbO$_3$, for example. However, the piezoelectric thin film may be made of another piezoelectric monocrystal, such as LiTaO$_3$. The thickness of the piezoelectric thin film 5 is preferably within the range of not less than about 0.01, and not greater than about 2.0λ, for example, when a wavelength value determined by the wavelength of the electrode finger period of the interdigital transducer electrode is denoted by λ. When the thickness of the piezoelectric thin film 5 is within this range, it is possible to effectively excite the S0 mode of plate waves. However, the thickness of the piezoelectric thin film 5 may be outside of the above range.

The elastic wave device 1 utilizes the S0 mode of plate waves that were newly discovered by the inventors of preferred embodiments of the present invention. The inventors also discovered that, in order to utilize the S0 mode, it is necessary to utilize an S0 mode of plate waves and to provide the conductive layer 8 below the piezoelectric thin film 5.

As shown in FIG. 1B, in the S0 mode of plate waves, the piezoelectric thin film 5 is displaced in a direction parallel or substantially parallel to the surface direction of the first principal surface 5a of the piezoelectric thin film 5.

An elastic wave device of Example 1 as an example of the first preferred embodiment of the present invention and an elastic wave device of Comparative Example 1 are produced. Elastic wave devices in which each layer is laminated in order from an interdigital transducer electrode toward a supporting substrate as described below are produced.

Example 1

Interdigital transducer electrode: Al, thickness about 0.07λ/piezoelectric thin film: a LiNbO$_3$ film having Euler Angles (0°, 120°, 0°), thickness about 0.12λ/conductive layer: an Al film, thickness about 0.035λ/low acoustic impedance film: an SiO$_2$ film, thickness about 0.2λ/high acoustic impedance film: a Pt film, thickness about 0.1λ/low acoustic impedance film: an SiO$_2$ film, thickness about 0.2λ/high acoustic impedance film: a Pt film, thickness about 0.1λ/low acoustic impedance film: an SiO$_2$ film, thickness about 0.265λ/supporting substrate: a Si substrate.

Comparative Example 1

Interdigital transducer electrode: Al, thickness 0.07λ/piezoelectric thin film: a LiNbO$_3$ film having Euler Angles (90°, 90°, 40°), thickness about 0.1λ/low acoustic impedance film: a SiO$_2$ film, thickness about 0.14λ/high acoustic impedance film: a Pt film, thickness about 0.09λ/low acoustic impedance film: a SiO$_2$ film, thickness about 0.14λ/high acoustic impedance film: a Pt film, thickness about 0.09λ/low acoustic impedance film: a SiO$_2$ film, thickness about 0.4λ/supporting substrate: a Si substrate.

In Example 1 and Comparative Example 1, Q of LiNbO$_3$ is assumed to be about 1000, and the duty of the interdigital transducer electrode is set to about 0.5. Also in Example 2 and subsequent examples described later, the duty of each interdigital transducer electrode is set to about 0.5.

Figure 2:
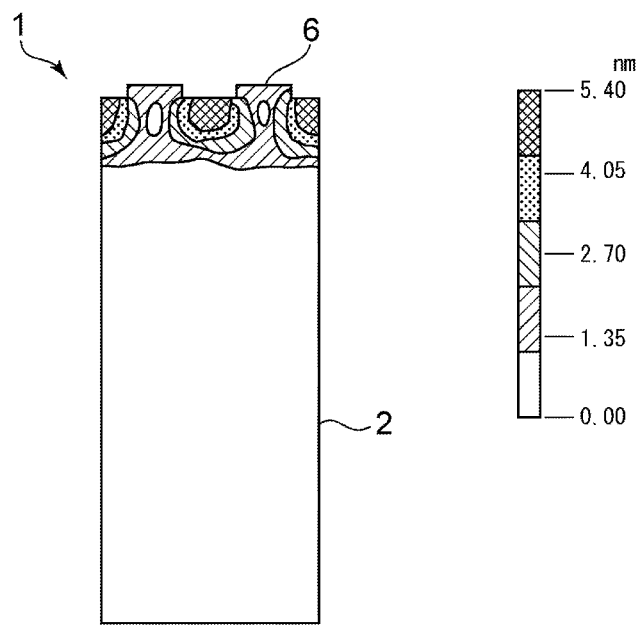
FIG. 2 is a schematic diagram showing a displacement distribution in the case in which an S0 mode of plate waves according to Example 1 of the present invention is excited.

FIG. 2 is a schematic diagram showing a displacement distribution in the case in which the piezoelectric thin film 5 is excited in the S0 mode of plate waves in the elastic wave device 1 of Example 1. The displacement distribution is a result obtained through analysis (simulation) by the finite element method. A scale of displacement amounts in a region that is not hatched and in each region that is hatched by oblique lines in FIG. 2 is shown at the right side in FIG. 2.

As is clear from FIG. 2, in Example 1, a piezoelectric thin film portion in each region below spaces between electrode fingers of the interdigital transducer electrode 6 is displaced by a greater amount than the electrode fingers and a piezoelectric thin film portion in a region below each electrode finger. In the elastic wave device 1, such a displacement distribution is considered to be achieved since the conductive layer 8 is provided on the second principal surface 5b of the piezoelectric thin film 5.

Figure 3:
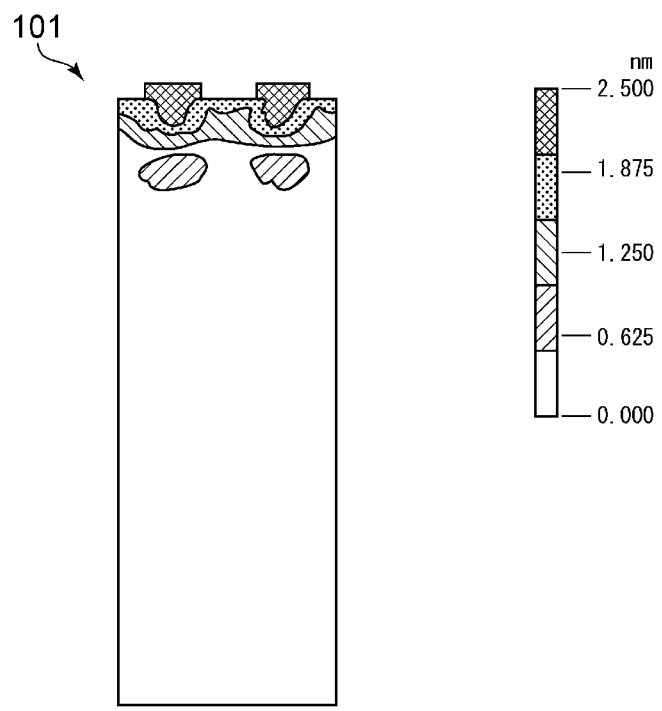
FIG. 3 is a schematic diagram showing a displacement distribution in the case in which an S0 mode of plate waves of Comparative Example 1 is excited.

FIG. 3 shows a displacement distribution in the case in which an S0 mode of plate waves of the elastic wave device of Comparative Example 1 is excited. As is clear from FIG. 3, in the elastic wave device 101 of Comparative Example 1, the electrode fingers of the interdigital transducer electrode and a piezoelectric thin film portion in a region below each electrode finger are displaced by the greatest amount. On the other hand, a piezoelectric thin film portion in a region below spaces between the electrode fingers is displaced by a smaller amount.

As is clear from a comparison of FIG. 2 and FIG. 3, the portions that are displaced by the greatest amount in the S0 mode of plate waves in the elastic wave device 1 of Example 1 are totally different from those in the S0 mode of plate waves in the elastic wave device 101 of Comparative Example 1, and in the S0 mode of plate waves in preferred embodiments of the present invention, the electrode fingers and the piezoelectric thin film portion in the region below each electrode finger do not have a large displacement.

Figure 4:
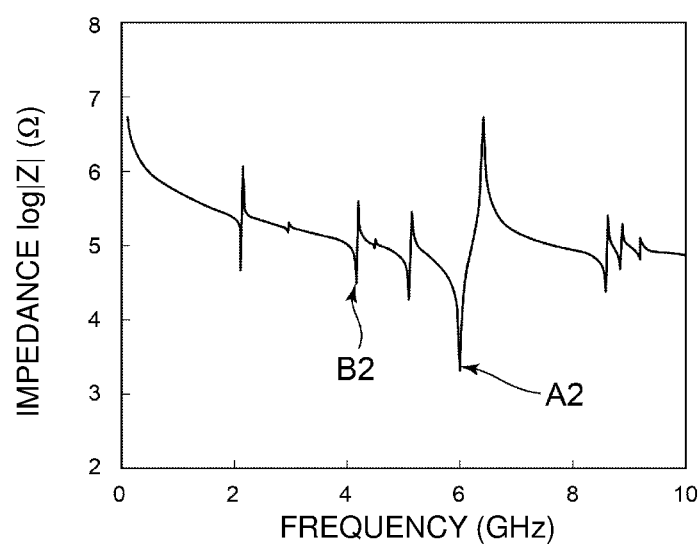
FIG. 4 is a diagram showing impedance characteristics of an elastic wave device of Comparative Example 1.
Figure 5:
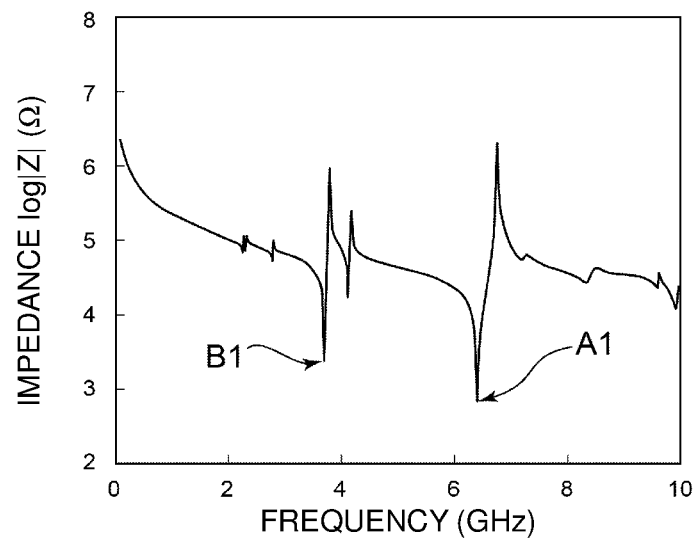
FIG. 5 is a diagram showing impedance characteristics of an elastic wave device of Example 1.

FIG. 4 is a diagram showing impedance characteristics of the elastic wave device of Comparative Example 1. FIG. 5 is a diagram showing impedance characteristics of the elastic wave device of Example 1. In each of FIG. 4 and FIG. 5, a response at approximately 6 GHz shown by an arrow A1 or A2 is a response of the S0 mode of plate waves. A response at approximately 4 GHz shown by an arrow B1 or B2 is a response of an SH0 mode.

As is clear from a comparison between FIG. 4 and FIG. 5, according to Example 1, it is possible to increase the response of the S0 mode as compared to Comparative Example 1. That is, it is possible to increase an impedance ratio Za/Zr which is the ratio of impedance Za at an anti-resonant frequency relative to impedance Zr at a resonant frequency in the S0 mode. Thus, it is possible to easily obtain a resonator having a high band width ratio.

Next, the following elastic wave devices of Example 2 and Comparative Example 2 are produced. Each layer described below is laminated in order from the interdigital transducer electrode side.

Example 2

Interdigital transducer electrode: Al, thickness about 0.07λ, piezoelectric thin film: a LiNbO₃ film having Euler Angles (0°, 120°, 0°), thickness about 0.1λ, conductive layer: a Ti film, thickness about 0.01λ. The structure from the lower side of the conductive layer to the supporting substrate is preferably the same or substantially the same as that in Example 1.

Comparative Example 2

The structure is the same or substantially the same as in Example 2 except that no conductive layer is provided at the second principal surface side of the LiNbO₃ film.

Figure 6:
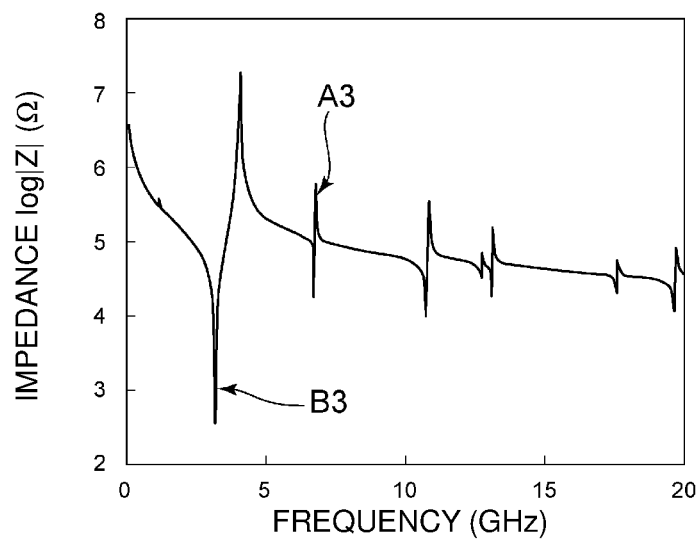
FIG. 6 is a diagram showing impedance characteristics of an elastic wave device of Comparative Example 2.
Figure 7:
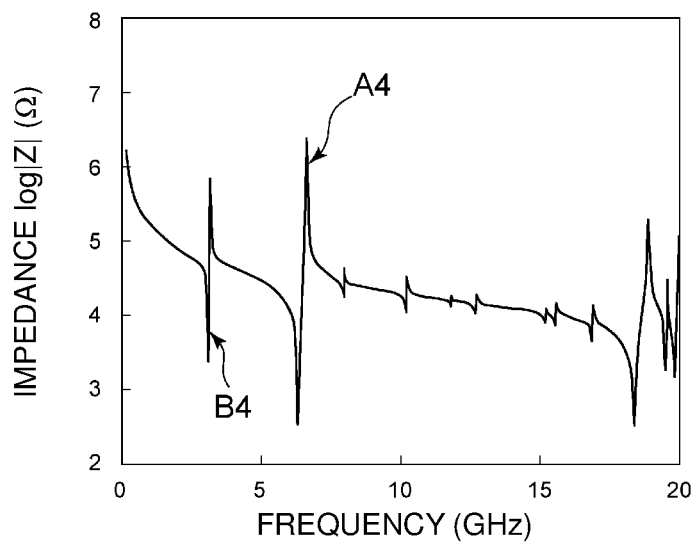
FIG. 7 is a diagram showing impedance characteristics of an elastic wave device according to Example 2.

FIG. 6 is a diagram showing impedance characteristics of the elastic wave device of Comparative Example 2. FIG. 7 is a diagram showing impedance characteristics of the elastic wave device of Example 2.

In each of FIG. 6 and FIG. 7, a response at approximately 6 GHz shown by an arrow A3 or A4 is a response of an S0 mode of plate waves. A response at approximately 3 GHz shown by an arrow B3 or B4 is a response of an SH0 mode.

As is clear from a comparison of FIG. 6 and FIG. 7, according to Example 2, it is possible to increase the response of the S0 mode as compared to the elastic wave device of Comparative Example 2. That is, it is possible to increase the impedance ratio Za/Zr which is the ratio of the impedance Za at the anti-resonant frequency relative to the impedance Zr at the resonant frequency in the S0 mode. Therefore, it is possible to easily obtain a resonator having a high band width ratio.

As described above, the elastic wave device 1 according to the first preferred embodiment has a displacement distribution that is newly discovered by the inventors of preferred embodiments of the present invention, since the S0 mode of plate waves is utilized and the conductive layer 8 is provided on the second principal surface 5b of the piezoelectric thin film 5. In addition, in the elastic wave device 1, even when the thickness of the interdigital transducer electrode varies, the acoustic velocity or the frequency characteristics are less likely to vary. This will be described with reference to FIGS. 8 to 10.

The following elastic wave devices of Examples 3 and 4 and elastic wave devices of Comparative Examples 3 and 4 are produced. Each layer is laminated in order from the interdigital transducer electrode toward the supporting substrate as described below.

Example 3

Interdigital transducer electrode: Al, the thickness is changed in the range of not less than about 0.02λ and not greater than about 0.2λ. Piezoelectric thin film: a LiNbO₃ film, thickness about 0.1λ/conductive layer: a Ti film, thickness about 0.03λ/low acoustic impedance film: a SiO₂ film, thickness about 0.26λ/high acoustic impedance film: a SiN film, thickness about 0.26λ/low acoustic impedance film: a SiO₂ film, thickness about 0.26λ/high acoustic impedance film: a SiN film, thickness about 0.26λ/low acoustic impedance film: a SiO₂ film, thickness about 0.14λ/supporting substrate: a Si substrate.

Example 4

Interdigital transducer electrode: Al, the thickness is changed in the range of not less than about 0.02λ and not greater than about 0.2λ. Piezoelectric thin film: a LiNbO₃ film, thickness about 0.1λ/conductive layer: a Ti film, thickness about 0.03λ/low acoustic impedance film: a SiO₂ film, thickness about 0.2λ/high acoustic impedance film: a Pt film, thickness about 0.1λ/low acoustic impedance film: a SiO₂ film, thickness about 0.2λ/high acoustic impedance film: a Pt film, thickness about 0.1λ/low acoustic impedance film: SiO₂ a film, thickness about 0.4λ/supporting substrate: a Si substrate.

Comparative Example 3

Interdigital transducer electrode: Al, the thickness is changed in the range of not less than about 0.02λ and not greater than about 0.1λ. Piezoelectric thin film: a LiNbO₃ film, thickness about 0.1λ/low acoustic impedance film: a SiO₂ film, thickness about 0.1λ/high acoustic impedance film: a SiN film, thickness about 0.11λ/low acoustic impedance film: a SiO₂ film, thickness about 0.1λ/high acoustic impedance film: a SiN film, thickness about 0.11λ/low acoustic impedance film: a SiO₂ film, thickness about 0.14λ/supporting substrate: a Si substrate.

Comparative Example 4

Interdigital transducer electrode: Al, the thickness is changed in the range of not less than about 0.02λ and not greater than about 0.14λ. Piezoelectric thin film: a LiNbO₃ film, thickness about 0.2λ/low acoustic impedance film: a SiO₂ film, thickness about 0.14λ/high acoustic impedance film: a Pt film, thickness about 0.09λ/low acoustic impedance film: a SiO₂ film, thickness about 0.14λ/high acoustic impedance film: a Pt film, thickness about 0.09λ/low acoustic impedance film: a SiO₂ film, thickness about 0.4λ/supporting substrate: a Si substrate.

A relationship between the electrode thickness of the interdigital transducer electrode and an acoustic velocity in Examples 3 and 4 and Comparative Examples 3 and 4 described above is obtained through analysis (simulation) by the finite element method.

Figure 8:
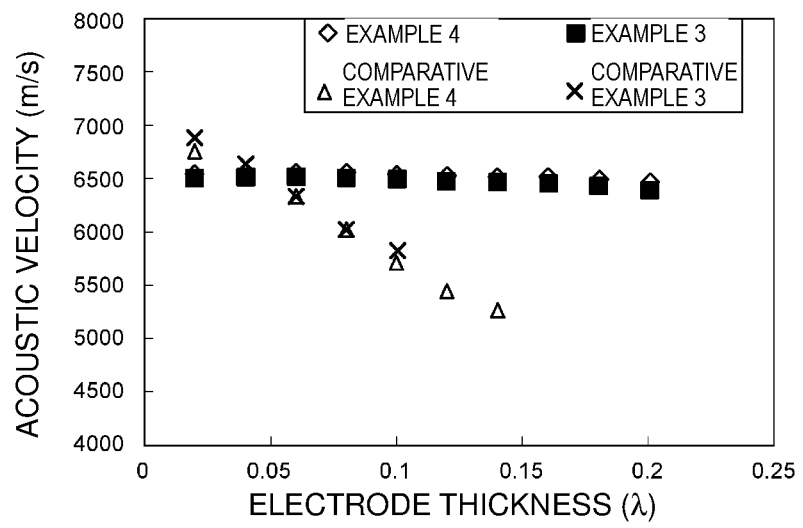
FIG. 8 is a diagram showing a relationship between an electrode thickness ($\lambda$) and an acoustic velocity in elastic wave devices according to Examples 3 and 4 and elastic wave devices according to Comparative Examples 3 and 4.

FIG. 8 shows the relationship between the electrode thickness of the interdigital transducer electrode and the acoustic velocity in Examples 3 and 4 and Comparative Examples 3 and 4 described above. As is clear from FIG. 8, in Comparative Examples 3 and 4, the acoustic velocity decreases as the electrode thickness of the interdigital transducer electrode increases from about 0.02λ.

On the other hand, in Examples 3 and 4, the acoustic velocity does not substantially change even when the electrode thickness of the interdigital transducer electrode is changed in the range of not less than about 0.02λ and not greater than about 0.2λ. That is, the change in the acoustic velocity in the S0 mode in the case in which the thickness of the interdigital transducer electrode is changed by one wavelength is very small. Therefore, it appears that even when the thickness of the interdigital transducer electrode is changed, a change in the acoustic velocity or a change in the frequency characteristics of the elastic wave device is less likely to occur.

In a second preferred embodiment of the present invention, when the thickness of the interdigital transducer electrode is changed by one wavelength, the change in the acoustic velocity is not greater about 9300 m/sec, and, therefore, it is possible to effectively reduce or prevent a change in the frequency characteristics due to the change in the electrode thickness. More preferably, the change in the acoustic velocity in the S0 mode in the case in which the thickness of the interdigital transducer electrode is changed by one wavelength is not greater than about 1000 m/sec, for example. In this case, it is possible to further reduce or prevent a change in the frequency characteristics.

Figure 9:
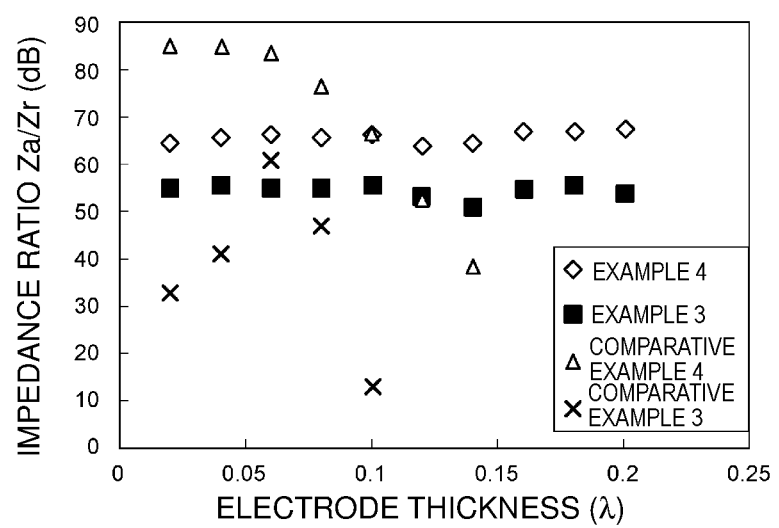
FIG. 9 is a diagram showing a relationship between the electrode thickness ($\lambda$) and an impedance ratio Za/Zr in the elastic wave devices according to Examples 3 and 4 and the elastic wave devices according to Comparative Examples 3 and 4.

FIG. 9 is a diagram showing a relationship between the electrode thicknesses of the interdigital transducer electrodes and the impedance ratios Za/Zr in the elastic wave devices of Examples 3 and 4 and Comparative Examples 3 and 4 described above. As is clear from FIG. 9, in Comparative Examples 3 and 4, the impedance ratio Za/Zr greatly changes as the electrode thickness changes.

On the other hand, in Examples 3 and 4, the change in the impedance ratio Za/Zr is very small even when the electrode thickness of the interdigital transducer electrode is changed in the range of not less than about $0.02\lambda$ and not greater than about $0.2\lambda$. Preferably, when the thickness of the interdigital transducer electrode is within the range of not less than about $0.02\lambda$ and not greater than about $0.2\lambda$, the impedance ratio Za/Zr is not greater than about 5 dB when being converted to that in the case of Al. Accordingly, it is possible to provide an elastic wave device having less change of frequency characteristics.

In particular, in Example 4 of the structure in which Pt films are used as the high acoustic impedance films and $SiO_2$ films are used as the low acoustic impedance films, when the electrode thickness is within the range of not less than about $0.02\lambda$ and not greater than about $0.2\lambda$, the difference between the maximum value and the minimum value of the impedance ratio Za/Zr is about 3.2 dB, which is very small. In addition, also in Example 3 in which SiN films are used as the high acoustic impedance films, the difference between the maximum value and the minimum value is about 4.5 dB, which is small. Therefore, preferably, by using Pt films or SiN films as the high acoustic impedance films, it is possible to more effectively decrease the change of the frequency characteristics than when using $SiO_2$ films as the low acoustic impedance films. More preferably, Pt films are used as the high acoustic impedance films, and $SiO_2$ films are used as the low acoustic impedance films, for example.

A non-limiting example of a method for producing the elastic wave device 1 will be described with reference to FIGS. 10A to 10C. In producing the elastic wave device 1, as shown in FIG. 10A, the conductive layer 8 and the acoustic reflection layer 3 are formed on one surface of a piezoelectric substrate 5A.

Figure 10A:
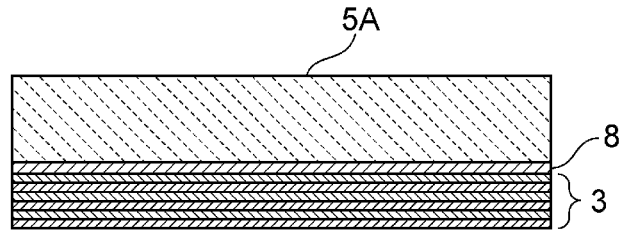
FIGS. 10A to 10C are front cross-sectional views for explaining a method for producing an elastic wave device according to a preferred embodiment of the present invention.
Figure 10B:
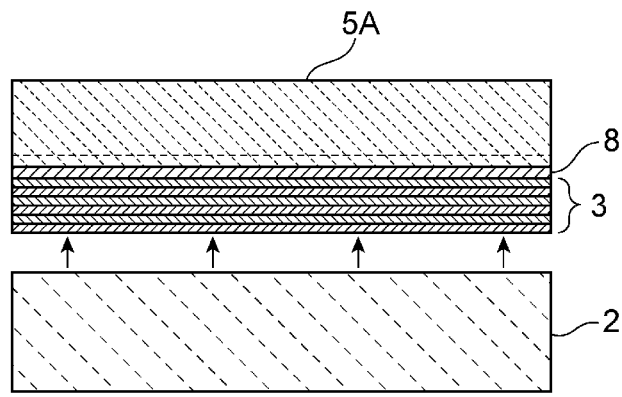
Figure 10C:
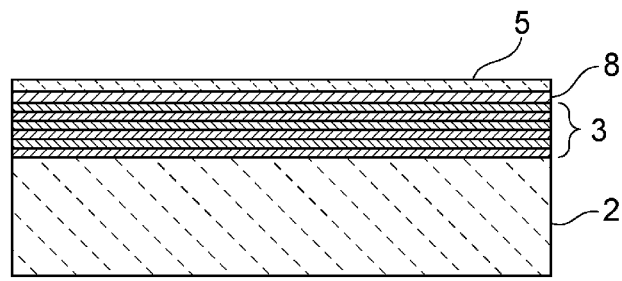

Next, as shown in FIG. 10B, the multilayer body shown in FIG. 10A is joined to the supporting substrate 2 from the acoustic reflection layer 3 side. Thereafter, as shown in FIG. 10C, the piezoelectric substrate 5A is polished by CMP polishing or other suitable method, for example, to be reduced in thickness. As the method for thinning the piezoelectric substrate 5A, a method may be used in which ions are injected to a desired depth of a substrate in advance and the substrate is delaminated at the interface of a layer damaged by the ion injection. The piezoelectric thin film 5 may be formed by any of the above methods. The interdigital transducer electrode 6 and the connection wire 7 shown in FIG. 1A are formed on the piezoelectric thin film 5.

In the polishing to obtain the piezoelectric thin film 5, in order to excite plate waves, polishing is preferably performed until the thickness of the piezoelectric thin film 5 falls within the range of not less than about $0.01\lambda$ and not greater than about $2.0\lambda$, for example. Accordingly, it is possible to effectively improve the efficiency of exciting plate waves.

In addition, regarding the structure of the interdigital transducer electrode and the connection wire, Al, for example, is preferably used in the first preferred embodiment, but an alloy, such as AlCu, may be used, for example. Furthermore, another metal or alloy such as Au or Ag may be used, for example. Moreover, the interdigital transducer electrode 6 may be formed by laminating a plurality of metal films as in a multilayer structure including Ti films and AlCu films, for example. Additionally, the thicknesses or the materials of the interdigital transducer electrode 6 and the connection wire 7 may be different from each other.

Figure 11:
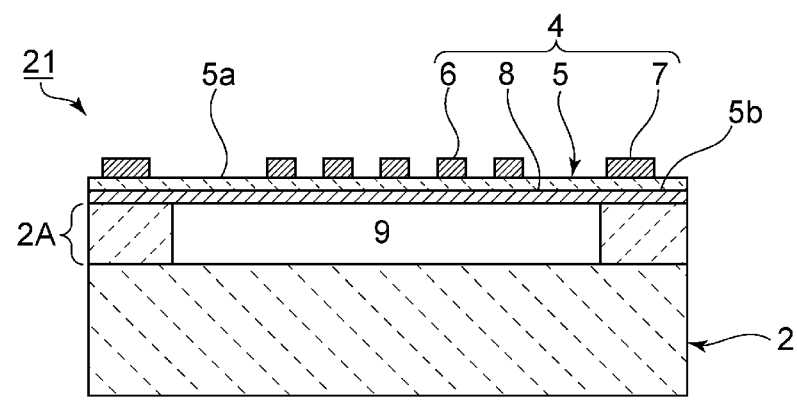
FIG. 11 is a front cross-sectional view of an elastic wave device according to a second preferred embodiment of the present invention.

FIG. 11 is a front cross-sectional view of an elastic wave device according to a second preferred embodiment of the present invention. In the elastic wave device 21 of the second preferred embodiment, a hollow portion 9 is provided. A supporting layer 2A and an elastic wave element portion 4 are laminated on the supporting substrate 2 so as to cover the hollow portion 9. Similar to the case of the first preferred embodiment, the elastic wave element portion 4 includes a conductive layer 8, a piezoelectric thin film 5, an interdigital transducer electrode 6, and a connection wire 7. The interdigital transducer electrode 6 is provided on the piezoelectric thin film 5 and directly above a region in which the hollow portion 9 is provided. As described above, the elastic wave device 21 may have a membrane structure in which a portion of the piezoelectric thin film 5 that is excited by the interdigital transducer electrode 6 faces the hollow portion 9. In this case, the elastic wave device 21 may be provided with a hollow portion within the supporting substrate 2, or may have a membrane structure in which a structure penetrating the supporting substrate 2 is provided, instead of the hollow portion 9.

Also in the elastic wave device 21, similar to the case of the first preferred embodiment, in the piezoelectric thin film 5, it is possible to utilize an S0 mode of plate waves in which a piezoelectric thin film portion in a region below spaces between the electrode fingers of the interdigital transducer electrode 6 is displaced by a greater amount than each electrode finger and a piezoelectric thin film portion in a region below each electrode finger. Therefore, as shown in the first preferred embodiment and Examples 1 to 4 described above, also in the second preferred embodiment, even when the thickness of the interdigital transducer electrode 6 is changed, it is possible to decrease a change in acoustic velocity. Accordingly, it is possible to effectively reduce or prevent a change in frequency characteristics due to the change in the thickness of the interdigital transducer electrode.

Also in the second preferred embodiment, the change in acoustic velocity in the case in which the thickness of the interdigital transducer electrode is changed by one wavelength is preferably not greater than about 9300 m/sec and more preferably not greater than about 1000 m/sec, for example.

An elastic wave device of Example 5 described below is produced as an example of the elastic wave device 21 of the second preferred embodiment.

Example 5

A multilayer structure from the interdigital transducer electrode side is as described below.

Interdigital transducer electrode: Al, the thickness is changed in the range of not less than about $0.02\lambda$ and not greater than about $0.22\lambda$. Piezoelectric thin film: a LiNbO$_3$ film, thickness about $0.1\lambda$/conductive layer: an Al film, thickness about $0.035\lambda$/supporting substrate: a Si substrate. Q of LiNbO$_3$ is assumed as about 1000, and the duty of the interdigital transducer electrode is set to about 0.5.

Figure 12:
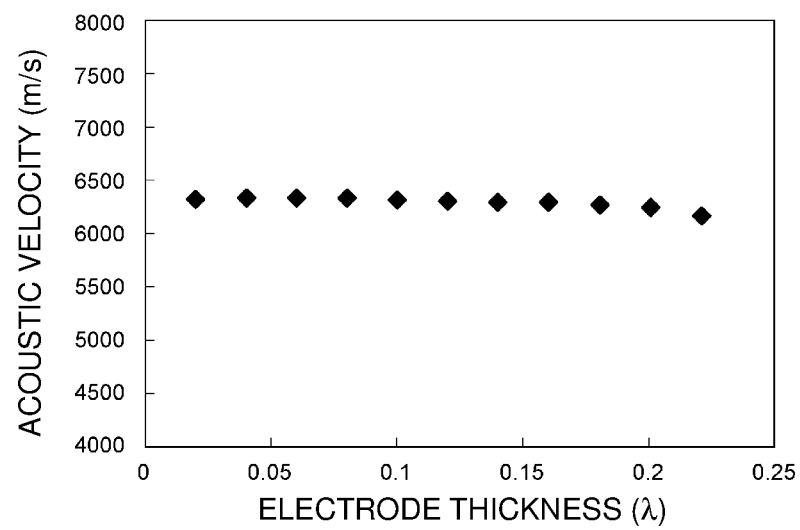
FIG. 12 shows a relationship between the electrode thickness of an interdigital transducer electrode and an acoustic velocity in an elastic wave device of Example 5.
Figure 13:
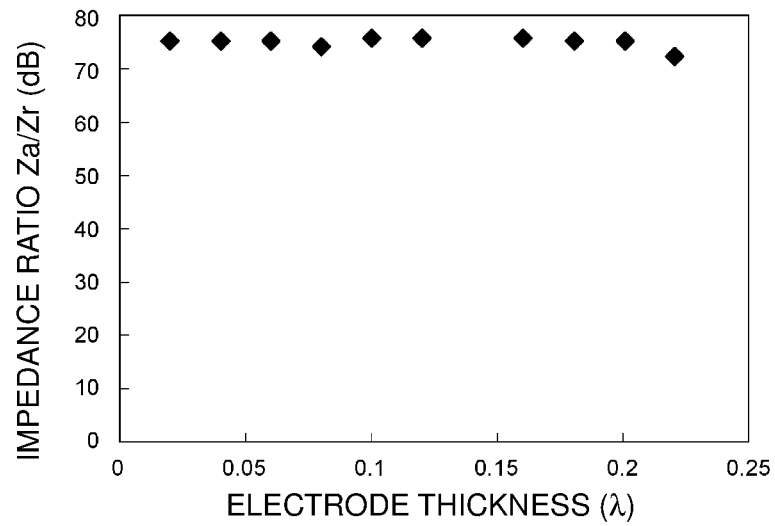
FIG. 13 shows a relationship between the electrode thickness of the interdigital transducer electrode and an impedance ratio Za/Zr in the elastic wave device of Example 5.

FIG. 12 shows a relationship between the electrode thickness of the interdigital transducer electrode and an acoustic velocity in the elastic wave device of Example 5, and FIG. 13 shows a relationship between the electrode thickness of the interdigital transducer electrode and an impedance ratio Za/Zr.

As is clear from FIG. 12, the change in acoustic velocity is very small even when the electrode thickness of the interdigital transducer electrode changes in the range of not less than about $0.02\lambda$ and not greater than about $0.2\lambda$, for example. In addition, the change in the impedance ratio Za/Zr due to the change in the electrode thickness is also small. That is, when the film thickness of the interdigital transducer electrode falls within the range of not less than about $0.02\lambda$ and not greater than about $0.2\lambda$, the difference between the maximum value and the minimum value of the impedance ratio Za/Zr is about 3.8 dB, which is very small.

Figure 14:
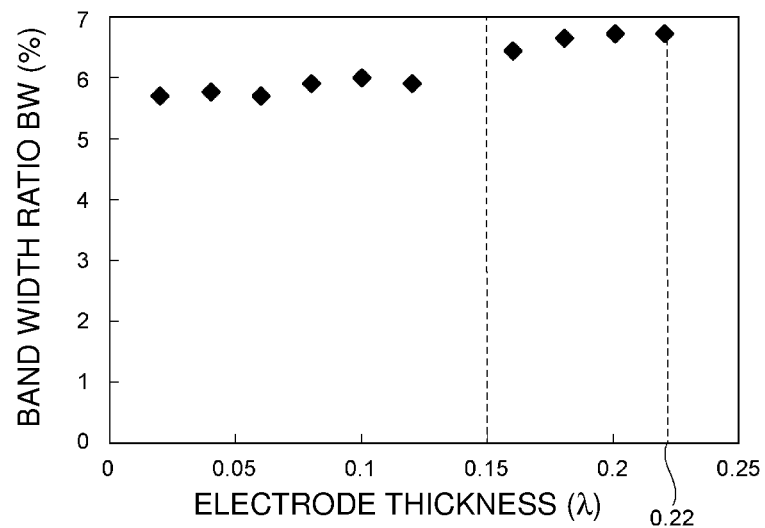
FIG. 14 is a diagram showing a relationship between the electrode thickness of the interdigital transducer electrode and a band width ratio BW (%) in the elastic wave device of Example 5.

FIG. 14 is a diagram showing a relationship between the electrode thickness of the interdigital transducer electrode and a band width ratio BW (%) in the elastic wave device of Example 5. The band width ratio BW is represented by {(anti-resonant frequency-resonant frequency)/resonant frequency}×100(%) in the elastic wave resonator.

As is clear from FIG. 14, the band width ratio BW tends to increase as the electrode thickness of the interdigital transducer electrode increases. In particular, in the case in which the electrode thickness of the interdigital transducer electrode is not less than about $0.15\lambda$ and not greater than about $0.22\lambda$, it is possible to effectively increase the band width ratio BW as compared to the case in which the electrode thickness of the interdigital transducer electrode is not greater than about $0.13\lambda$, for example. To expand the band width, the electrode thickness is preferably not less than about $0.15\lambda$ and not greater than about $0.22\lambda$, for example.

Next, the results of impedance ratio and band width ratio obtained in the case in which the Euler Angles of a LiNbO$_3$ substrate are changed will be described.

The following elastic wave device is produced as Example 6.

Interdigital transducer electrode: Al, thickness about $0.12\lambda$/piezoelectric thin film: a LiNbO$_3$ film, thickness about $0.1\lambda$/conductive layer: an Al film, thickness about $0.035\lambda$/supporting substrate: a Si substrate. An elastic wave device having a membrane structure is produced similarly as in Example 5. The duty of the interdigital transducer electrode is set to about 0.5.

Figure 15:
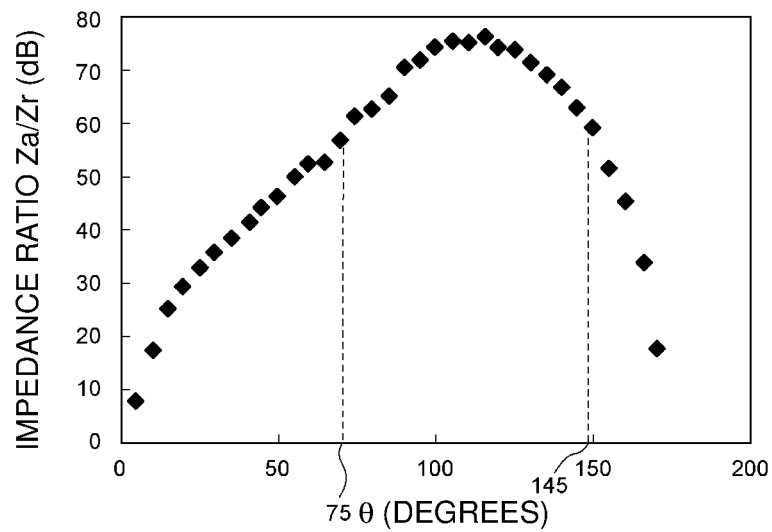
FIG. 15 is a diagram showing change of an impedance ratio Za/Zr in the case where $\theta$ of Euler Angles in an elastic wave device of Example 6 is changed.
Figure 16:
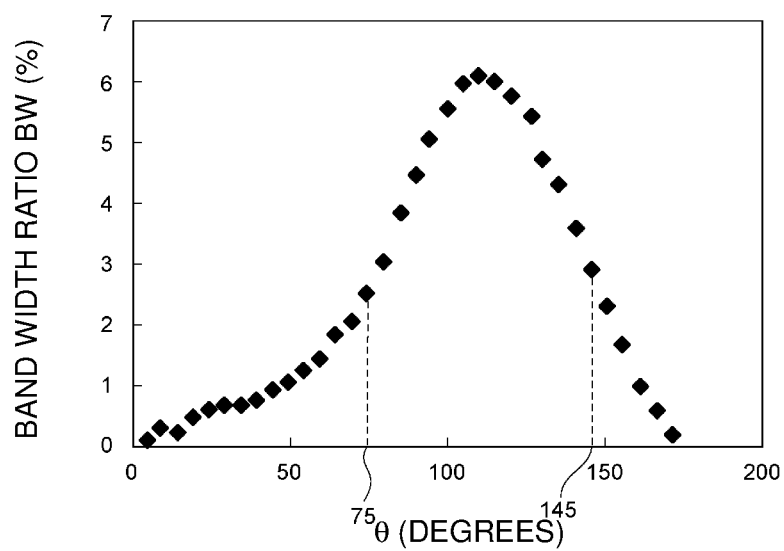
FIG. 16 is a diagram showing change of a band width ratio BW (%) in the case where $\theta$ of the Euler Angles in the elastic wave device of Example 6 is changed.

In the structure, in the Euler Angles (0°, θ, 0°) of the LiNbO$_3$ substrate, θ is changed. FIGS. 15 and 16 are diagrams showing change of the impedance ratio Za/Zr and change of the band width ratio BW in the case where θ of the Euler Angles is changed.

In this case, the acoustic velocity is within the range of not less than about 6265 m/sec and not greater than about 6390 m/sec. The impedance ratio Za/Zr is preferably higher, and more preferably exceeds about 60 dB to produce a device, such as a filter. In the case of producing a filter having a wide band width, the band width ratio BW is preferably high. As is clear from FIGS. 15 and 16, the Euler Angle θ is preferably not less than about 75° and not greater than about 145°, for example.

The following elastic wave device is also produced as Example 7.

Interdigital transducer electrode: Al, thickness about $0.12\lambda$/piezoelectric thin film: a LiNbO$_3$ film, thickness about $0.1\lambda$/conductive layer: an Al film, thickness about $0.035\lambda$/supporting substrate: a Si substrate. An elastic wave device having a membrane structure is also produced in Example 7. The duty of the interdigital transducer electrode is set to about 0.5.

Figure 17:
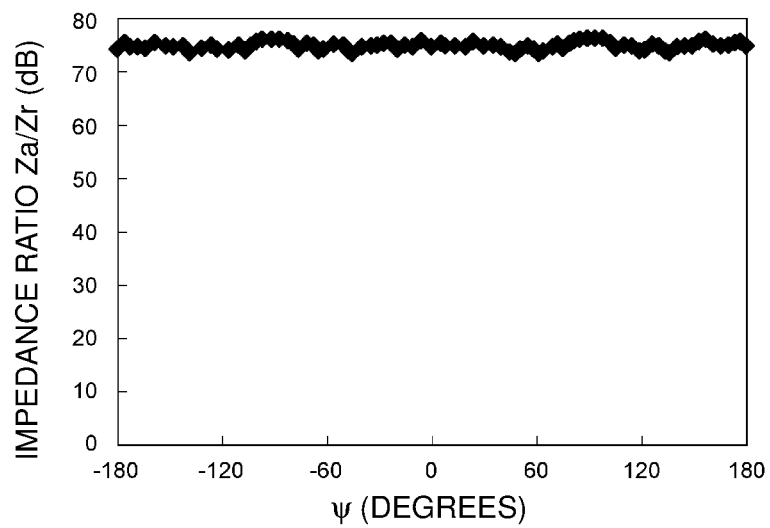
FIG. 17 is a diagram showing a relationship between $\psi$ of Euler Angles and an impedance ratio Za/Zr in Example 7.
Figure 18:
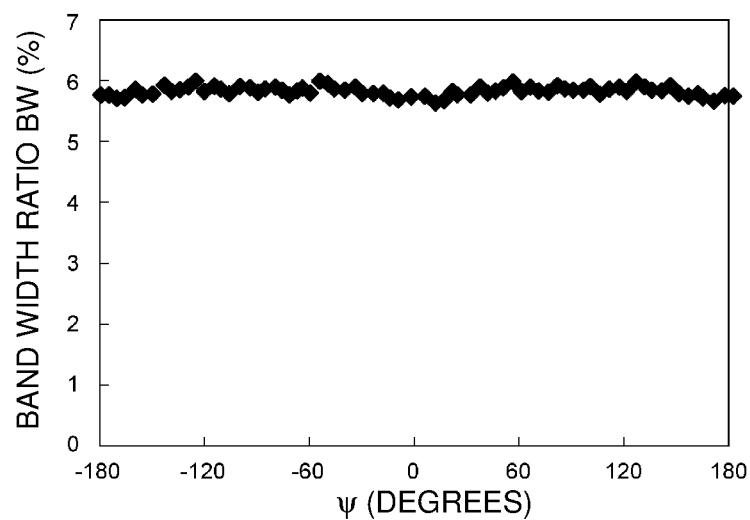
FIG. 18 is a diagram showing a relationship between $\psi$ of the Euler Angles and a band width ratio BW (%) in Example 7.

In Example 7, in the Euler Angles (0°, 120°, ψ) of the LiNbO$_3$ film, ψ is changed. FIG. 17 is a diagram showing a relationship between ψ of the Euler Angles and an impedance ratio Za/Zr in Example 7. FIG. 18 is a diagram showing a relationship between ψ of the Euler Angles and a band width ratio BW. As is clear from FIGS. 17 and 18, when ψ of the Euler Angles is changed, the impedance ratio Za/Zr and the band width ratio BW do not change very much.

Figure 19:
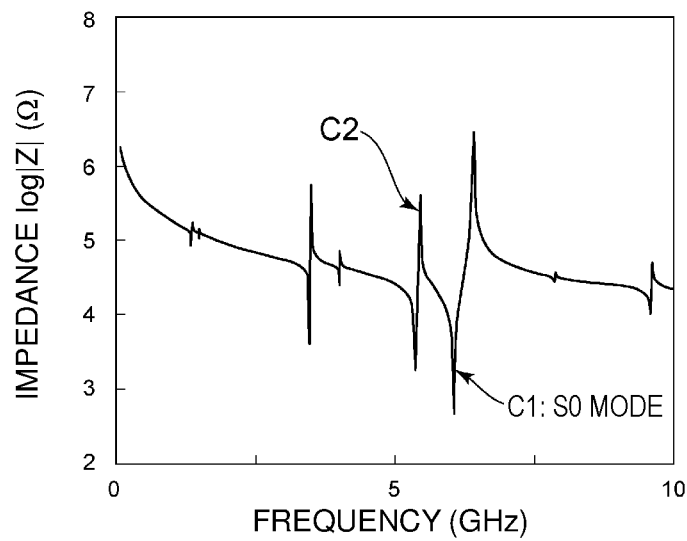
FIG. 19 is a diagram showing impedance characteristics for explaining an unwanted wave.
Figure 20:
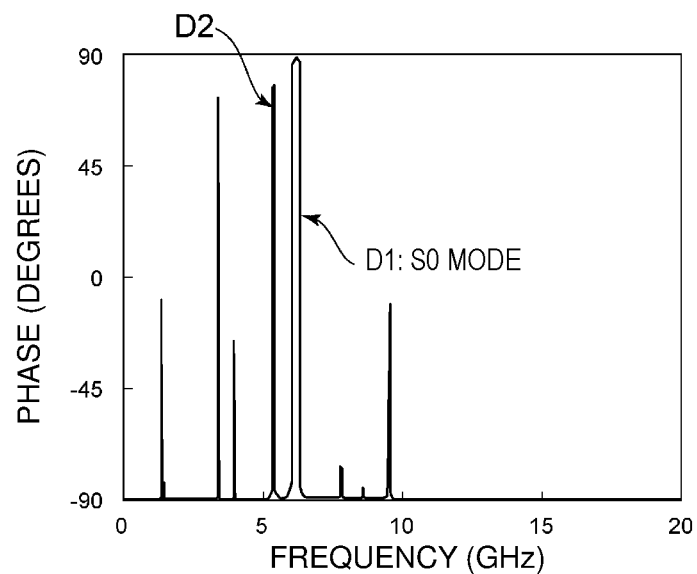
FIG. 20 is a diagram showing phase characteristics of an elastic wave device for the impedance characteristics shown in FIG. 19.
Figure 21:
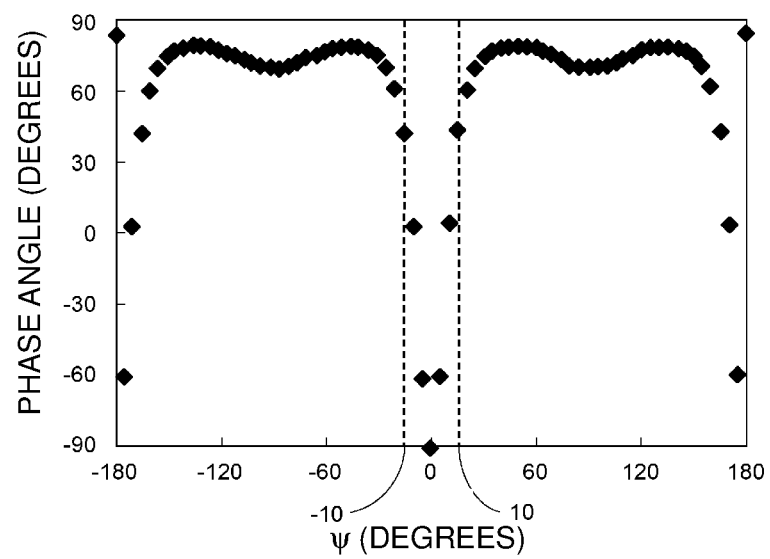
FIG. 21 is a diagram showing a relationship between $\psi$ of Euler Angles and the phase angle of an unwanted wave.

On the other hand, when ψ of the Euler Angles is changed, a response of an SH wave appears as an unwanted wave near the S0 mode of plate waves. FIG. 19 is a diagram showing impedance characteristics to explain the unwanted wave. In Example 7, in some cases, a response of an unwanted wave shown by an arrow C2 appears near an S0 mode shown by an arrow C1. FIG. 20 shows phase characteristics of an elastic wave device corresponding to the impedance characteristics in FIG. 19. In FIG. 20, a response of an unwanted wave shown by an arrow D2 appears largely near an S0 mode shown by an arrow D1. As described above, when a large unwanted wave is present near a response of the S0 mode, characteristics of the elastic wave device are deteriorated FIG. 21 is a diagram showing a relationship between ψ of the Euler Angles and the phase angle of the unwanted wave shown by the arrow D2. As is clear from FIG. 21, in the Euler Angles (0°, 120°, ψ), ψ is preferably not less than about −10° and not greater than about +10°, that is, within the range of about 0°±10°. Therefore, it is possible to reduce or prevent the response of the unwanted wave.

In this case, the acoustic velocity is not less than about 6170 m/sec and not greater than about 6470 m/sec.

The following elastic wave device is also produced as Example 8.

In Example 8, φ of the Euler Angles is changed. In addition, an elastic wave device having a membrane structure that is the same or substantially the same as in Example 7, except for this is produced in Example 8. The Euler Angles of the LiNbO$_3$ film are set as (φ, 120°, 0°), and φ is changed in the range of not less than about −30° and not greater than about +30°. In this case, the acoustic velocity is not less than about 6290 m/sec and not greater than about 6350 m/sec.

Figure 22:
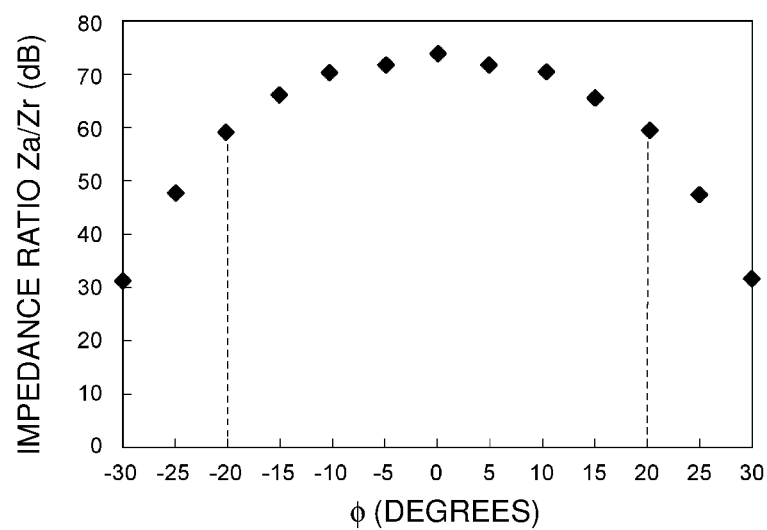
FIG. 22 is a diagram showing a relationship between $\varphi$ of Euler Angles and an impedance ratio Za/Zr in Example 8.
Figure 23:
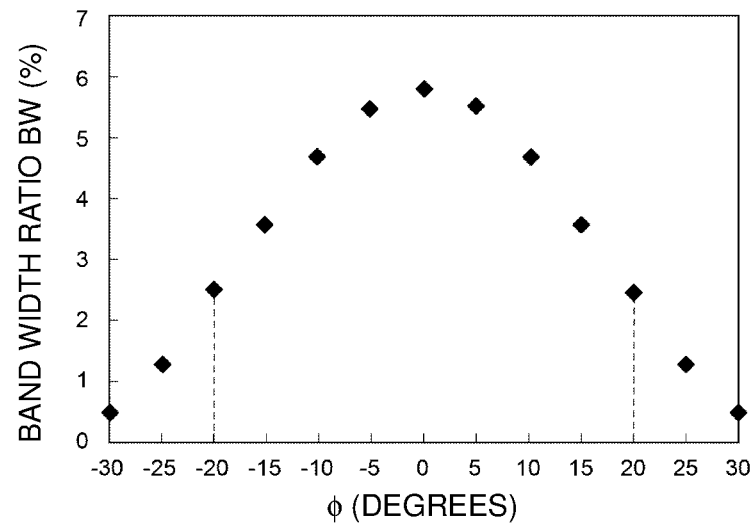
FIG. 23 is a diagram showing a relationship between $\varphi$ of the Euler Angles and a band width ratio BW (%) in Example 8.

FIGS. 22 and 23 are diagrams respectively showing a relationship between φ of the Euler Angles and an impedance ratio Za/Zr and a relationship between φ and a band width ratio BW in Example 8.

As is clear from FIGS. 22 and 23, φ of the Euler Angles is preferably not less than about −20° and not greater than about +20°, that is, within the range of about 0°±20°. Accordingly, it is possible to make the impedance ratio Za/Zr greater than about 60 dB, for example.

Thus, in a third preferred embodiment of the present invention, in the Euler Angles (φ, θ, ψ) of the piezoelectric thin film made of LiNbO₃, φ is within the range of about 0°±20°, θ is within the range of not less than about 75° and not greater than about 145°, and ψ is within the range of about 0°±10°. Accordingly, similar to the first and second preferred embodiments, it is possible to effectively reduce or prevent change in the acoustic velocity or a change in the frequency characteristics due to film thickness change of the interdigital transducer electrode.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a piezoelectric thin film including a first principal surface and a second principal surface opposing the first principal surface;
an interdigital transducer electrode provided on the first principal surface of the piezoelectric thin film and including a plurality of electrode fingers; and
a conductive layer provided on the second principal surface of the piezoelectric thin film; wherein
an elastic wave propagating in the piezoelectric thin film is an S0 mode of a plate wave;
a piezoelectric thin film portion in a region below spaces between the electrode fingers of the interdigital transducer electrode is displaced by a greater amount than each electrode finger and a piezoelectric thin film portion in a region below each electrode finger; and
in Euler Angles (φ, θ, ψ) of the piezoelectric thin film, φ is within a range of about 0°±20°, θ is within a range of not less than about 75° and not greater than about 145°, and ψ is within a range of about 0°±10°.

2. The elastic wave device according to claim 1, further comprising:
a supporting substrate; wherein
the conductive layer is laminated directly or indirectly on the supporting substrate.

3. The elastic wave device according to claim 2, further comprising:
an acoustic reflection layer; wherein
the acoustic reflection layer is provided between the conductive layer and the supporting substrate; and
the acoustic reflection layer includes a high acoustic impedance layer with relatively high acoustic impedance and a low acoustic impedance layer with relatively low acoustic impedance.

4. The elastic wave device according to claim 3, wherein the high acoustic impedance layer is made of silicon nitride, Pt, W, or tantalum oxide, and the low acoustic impedance layer is made of silicon oxide.

5. The elastic wave device according to claim 2, further comprising:
a supporting layer; wherein
the supporting layer supports the supporting substrate and the conductive layer; and
a hollow portion is provided within the elastic wave device and is surrounded by the supporting substrate, the conductive layer, and the supporting layer.

6. The elastic wave device according to claim 1, wherein a change in an acoustic velocity when a thickness of the interdigital transducer electrode is changed by one wavelength is not greater than about 9300 m/sec.

7. The elastic wave device according to claim 6, wherein when the thickness of the interdigital transducer electrode is changed by one wavelength, a change in the acoustic velocity is not greater than about 1000 m/sec.

8. An elastic wave device comprising:
a piezoelectric thin film including a first principal surface and a second principal surface opposing the first principal surface;
an interdigital transducer electrode provided on the first principal surface of the piezoelectric thin film and including a plurality of electrode fingers; and
a conductive layer provided on the second principal surface of the piezoelectric thin film; wherein
an elastic wave propagating in the piezoelectric thin film is an S0 mode of a plate wave; and
a change in an acoustic velocity in the S0 mode of the plate wave when a thickness of the interdigital transducer electrode is changed by one wavelength is not greater than about 9300 m/sec.

9. The elastic wave device according to claim 8, further comprising:
a supporting substrate; wherein
the conductive layer is laminated directly or indirectly on the supporting substrate.

10. The elastic wave device according to claim 9, further comprising:
an acoustic reflection layer; wherein
the acoustic reflection layer is provided between the conductive layer and the supporting substrate; and
the acoustic reflection layer includes a high acoustic impedance layer with relatively high acoustic impedance and a low acoustic impedance layer with relatively low acoustic impedance.

11. The elastic wave device according to claim 10, wherein the high acoustic impedance layer is made of silicon nitride, Pt, W, or tantalum oxide, and the low acoustic impedance layer is made of silicon oxide.

12. The elastic wave device according to claim 9, further comprising:
a supporting layer; wherein the supporting layer supports the supporting substrate and the conductive layer; and
a hollow portion is provided within the elastic wave device and is surrounded by the supporting substrate, the conductive layer, and the supporting layer.

13. The elastic wave device according to claim 8, wherein when the thickness of the interdigital transducer electrode is changed by one wavelength, a change in the acoustic velocity is not greater than about 1000 m/sec.

14. The elastic wave device according to claim 13, wherein in Euler Angles (φ, θ, ψ) of the piezoelectric thin film, φ is within a range of about 0°±20°, θ is within a range of not less than about 75° and not greater than about 145°, and ψ is within a range of about 0°±10°.

15. An elastic wave device comprising:
a piezoelectric thin film formed from LiNbO₃ and including a first principal surface and a second principal surface opposing the first principal surface;
an interdigital transducer electrode provided on the first principal surface of the piezoelectric thin film and including a plurality of electrode fingers; and
a conductive layer provided on the second principal surface of the piezoelectric thin film; wherein
an elastic wave propagating in the piezoelectric thin film is an S0 mode of a plate wave; and
in Euler Angles (φ, θ, ψ) of the piezoelectric thin film, φ is within a range of about 0°±20°, θ is within a range of not less than about 75° and not greater than about 145°, and ψ is within a range of about 0°±10°.

16. The elastic wave device according to claim 15, further comprising:
a supporting substrate; wherein
the conductive layer is laminated directly or indirectly on the supporting substrate.

17. The elastic wave device according to claim 16, further comprising:
an acoustic reflection layer; wherein
the acoustic reflection layer is provided between the conductive layer and the supporting substrate; and
the acoustic reflection layer includes a high acoustic impedance layer with relatively high acoustic impedance and a low acoustic impedance layer with relatively low acoustic impedance.

18. The elastic wave device according to claim 17, wherein the high acoustic impedance layer is made of silicon nitride, Pt, W, or tantalum oxide, and the low acoustic impedance layer is made of silicon oxide.

19. The elastic wave device according to claim 16, further comprising:
a supporting layer; wherein
the supporting layer supports the supporting substrate and the conductive layer; and
a hollow portion is provided within the elastic wave device and is surrounded by the supporting substrate, the conductive layer, and the supporting layer.

* * * * *